(12) United States Patent
Baltar

(10) Patent No.: US 9,710,376 B2
(45) Date of Patent: *Jul. 18, 2017

(54) WEAR LEVELING FOR A MEMORY DEVICE

(71) Applicant: MICRON TECHNOLOGY, INC., Boise, ID (US)

(72) Inventor: Robert Baltar, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 37 days.

This patent is subject to a terminal disclaimer.

(21) Appl. No.: 14/753,369

(22) Filed: Jun. 29, 2015

(65) Prior Publication Data

US 2015/0301937 A1 Oct. 22, 2015

Related U.S. Application Data

(63) Continuation of application No. 13/197,460, filed on Aug. 3, 2011, now Pat. No. 9,104,547.

(51) Int. Cl.
*G06F 12/00* (2006.01)
*G06F 12/02* (2006.01)
(Continued)

(52) U.S. Cl.
CPC ...... *G06F 12/0246* (2013.01); *G11C 11/5628* (2013.01); *G11C 16/0483* (2013.01); *G11C 16/3495* (2013.01); *G06F 2212/7211* (2013.01)

(58) Field of Classification Search
None
See application file for complete search history.

(56) References Cited

U.S. PATENT DOCUMENTS 7,155,589 B2 12/2006 Chevallier et al.
9,104,547 B2 * 8/2015 Baltar ................ G06F 12/0246
(Continued)

FOREIGN PATENT DOCUMENTS

JP 2010250143 11/2010
JP 2011150454 8/2011
WO 2008106778 12/2008

OTHER PUBLICATIONS

European Search Report for EPC Patent Application No. 12819791. 0, mailed Mar. 16, 2015, 8 pages.

*Primary Examiner* — Daniel Tsui
(74) *Attorney, Agent, or Firm* — Dicke, Billig & Czaja, PLLC

(57) ABSTRACT

Methods of operating a memory device are useful in managing wear leveling operations. Such methods include receiving an instruction from a host device in communication with the memory device, wherein the instruction comprises a command portion indicating a desire to identify portions of the memory device to be excluded from wear leveling operations and an argument portion comprising information identifying a particular group of one or more blocks of the plurality of blocks; storing the information identifying the particular group of one or more blocks to a non-volatile memory of the memory device as a portion of information identifying blocks to be excluded from wear leveling operations; and performing one or more wear leveling operations only on a subset of the plurality of blocks responsive to the information identifying blocks to be excluded from wear leveling operation.

20 Claims, 7 Drawing Sheets

(51) Int. Cl.
*G11C 11/56* (2006.01)
*G11C 16/04* (2006.01)
*G11C 16/34* (2006.01)

(56) References Cited

U.S. PATENT DOCUMENTS

| | | |
|---|---|---|
| 2006/0106972 A1 | 5/2006 | Gorobets et al. |
| 2006/0256623 A1 | 11/2006 | Roohparvar |
| 2008/0168216 A1 | 7/2008 | Lee |
| 2009/0091978 A1 | 4/2009 | Yeh |
| 2009/0259799 A1 | 10/2009 | Wong |
| 2010/0318719 A1 | 12/2010 | Keays et al. |
| 2011/0029808 A1 | 2/2011 | Moshayedi |
| 2011/0066789 A1 | 3/2011 | Wakrat et al. |
| 2011/0066792 A1* | 3/2011 | Shaeffer ............. G06F 12/0246 711/103 |
| 2011/0208917 A1* | 8/2011 | Lakshmi ............. G06F 12/0804 711/135 |

* cited by examiner

WEAR LEVELING FOR A MEMORY DEVICE

RELATED APPLICATION

This is a continuation of U.S. application Ser. No. 13/197,460, titled "WEAR LEVELING FOR A MEMORY DEVICE," filed Aug. 3, 2011, now U.S. Pat. No. 9,104,547 issued on Aug. 11, 2015, which is commonly assigned and incorporated in its entirety herein by reference.

TECHNICAL FIELD

The present disclosure relates generally to semiconductor memories and, in particular, in one or more embodiments, the present disclosure relates to wear leveling of memory cells in non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data state of each cell. Data can be read from the memory cells by performing a read operation. Memory cells are typically programmed using erase and programming cycles. For example, memory cells of a particular block of memory cells are first erased and then selectively programmed.

These program/erase cycles cause wear of the memory cells to occur. As the memory cells wear, issues such as oxide degradation, slower performance and increased probability of failures might occur. The number of program/erase cycles can also affect data retention characteristics of the memory cells. For example, a typical memory cell might exhibit a data retention life of 20 years or a particular level of reliability for 100,000 program/erase cycles. However, the expected data retention of the memory cells is reduced as the number of program/erase cycles performed on the memory cells increases. The application where the memory device is used will typically dictate whether data retention or a high number of program/erase cycles is more important to the user. Various data management methods are utilized to address these wear issues. Methods typically referred to as wear leveling methods (e.g., operations) are performed on memory cells in order to address these wear issues in memory devices. Generally, wear leveling refers to moving data and/or adjusting where data is stored in the memory device in an attempt to spread the wear effects around the device.

One type of wear leveling operation is dynamic wear leveling and is typically managed by a host system (e.g., processor) utilizing the memory device. The host system monitors memory usage in the device to determine if particular memory locations are experiencing more program/erase cycles than other memory locations in the memory device. Thus, the host system dynamically adjusts its addressing of memory locations in the memory device to reduce the number of program/erase cycles the particular memory locations experience relative to other memory locations in the memory device.

Another type of wear leveling operation is static wear leveling which performs wear leveling operations in a uniform manner without focusing on usage of particular memory locations as is done in dynamic wear leveling. Static wear leveling operates essentially independent of how often the host system is accessing particular locations in memory, for example.

Whether dynamic or static wear leveling methods are being employed, data stored in the memory device which is not being modified (e.g., changed or updated) might still be moved from one memory location to another. This movement of data results in additional program/erase cycles which can lead to an unwanted reduction in data retention characteristics as discussed above.

For the reasons stated above, and for other reasons stated below which will become apparent to those skilled in the art upon reading and understanding the present disclosure, there is a need in the art for alternate methods for managing wear leveling operations in memory devices.

DETAILED DESCRIPTION

Figure 1:
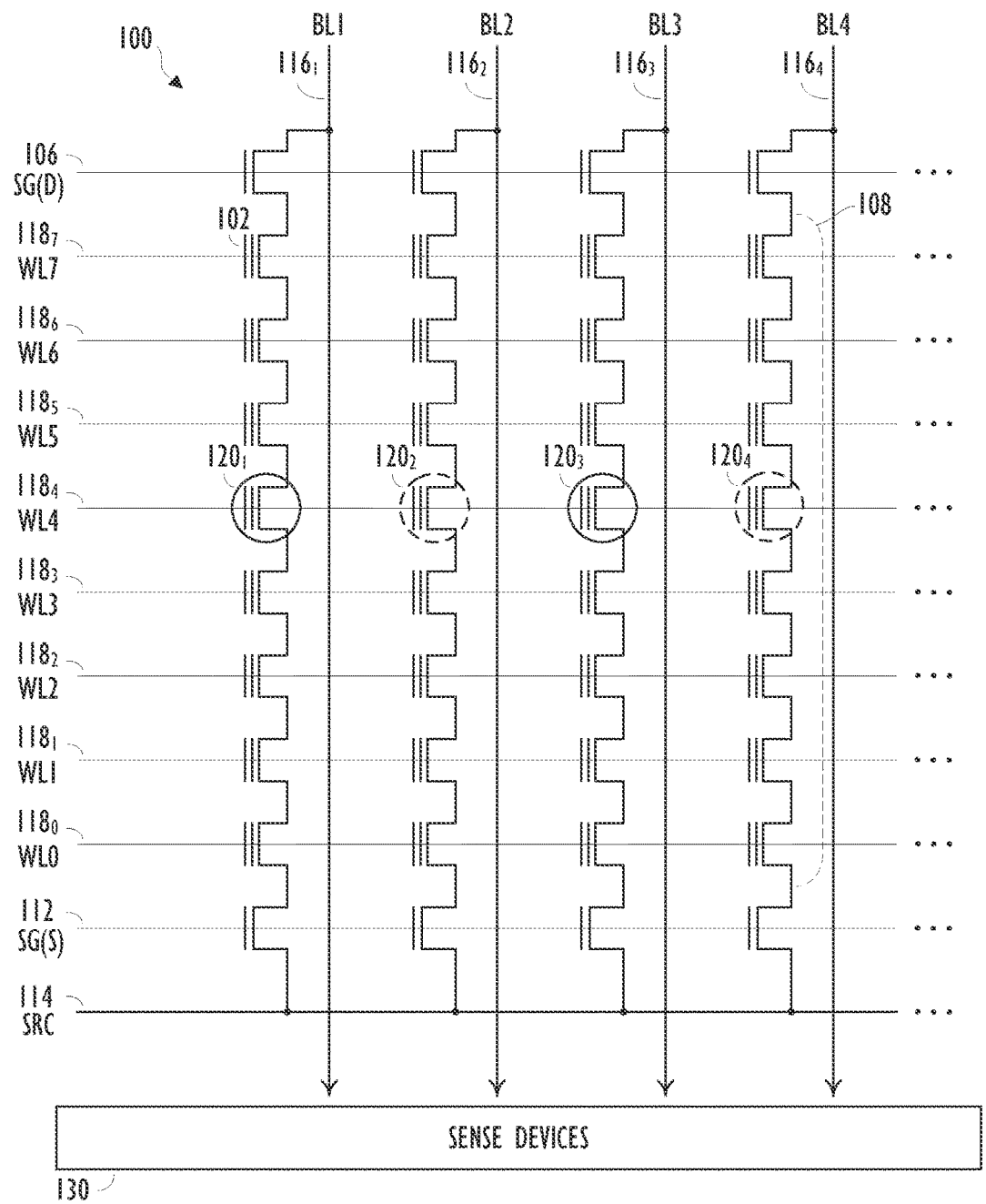
FIG. 1 shows a schematic representation of an array of NAND configured memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NAND Flash and NOR Flash. The designation is derived from the logic used to read the devices. FIG. 1 illustrates a NAND type flash memory array architecture 100 wherein the memory cells 102 of the memory array are logically arranged in an array of rows and columns. In a conventional NAND Flash architecture, "rows" refer to memory cells having commonly coupled control gates 120, while "columns" refer to memory cells coupled as a particular string of memory cells 108, for example. The memory cells 102 of the array are arranged together in strings (e.g., NAND strings), typically of 8, 16, 32, or more each. Each memory cell of a string are connected together in series, source to drain, between a source line 114 and a data line 116, often referred to as a bit line. The array is accessed by a row decoder (not shown) activating a logical row of memory cells by selecting a particular access line, often referred to as a word line, such as WL7-WL0 $118_{7-0}$, for example. Each word line 118 is coupled to the control gates of a row of memory cells. Bit lines BL1-BL4 $116_{1-4}$ can be driven high or low depending on the type of operation being performed on the array. These bit lines BL1-BL4 $116_{1-4}$ are coupled to sense devices (e.g., sense amplifiers) 130 that detect the state of a target memory cell by sensing voltage or current on a particular bit line 116, for example. As is known to those skilled in the art, the number of memory cells, word lines and bit lines might be much greater than those shown in FIG. 1.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells.

Programming typically involves applying one or more programming pulses to a selected word line (e.g., WL4 $118_4$) and thus to the control gate of each memory cell $120_{1-4}$ coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the charge storage structures of memory cells targeted for programming. More specifically, the charge storage structures are typically charged through direct injection or Fowler-Nordheim tunneling of electrons from the channel to the storage structure, resulting in a Vt typically greater than zero, for example. In addition, an inhibit voltage is typically applied to bit lines not coupled to a NAND string containing a memory cell that is targeted (e.g., selected) for programming. Typically a verify operation is performed following each applied programming pulse to determine if the selected memory cells have achieved their target (e.g., intended) programmed state. A verify operation generally includes performing a sense operation to determine if a threshold voltage of a memory cell has reached a particular target value.

Figure 2:
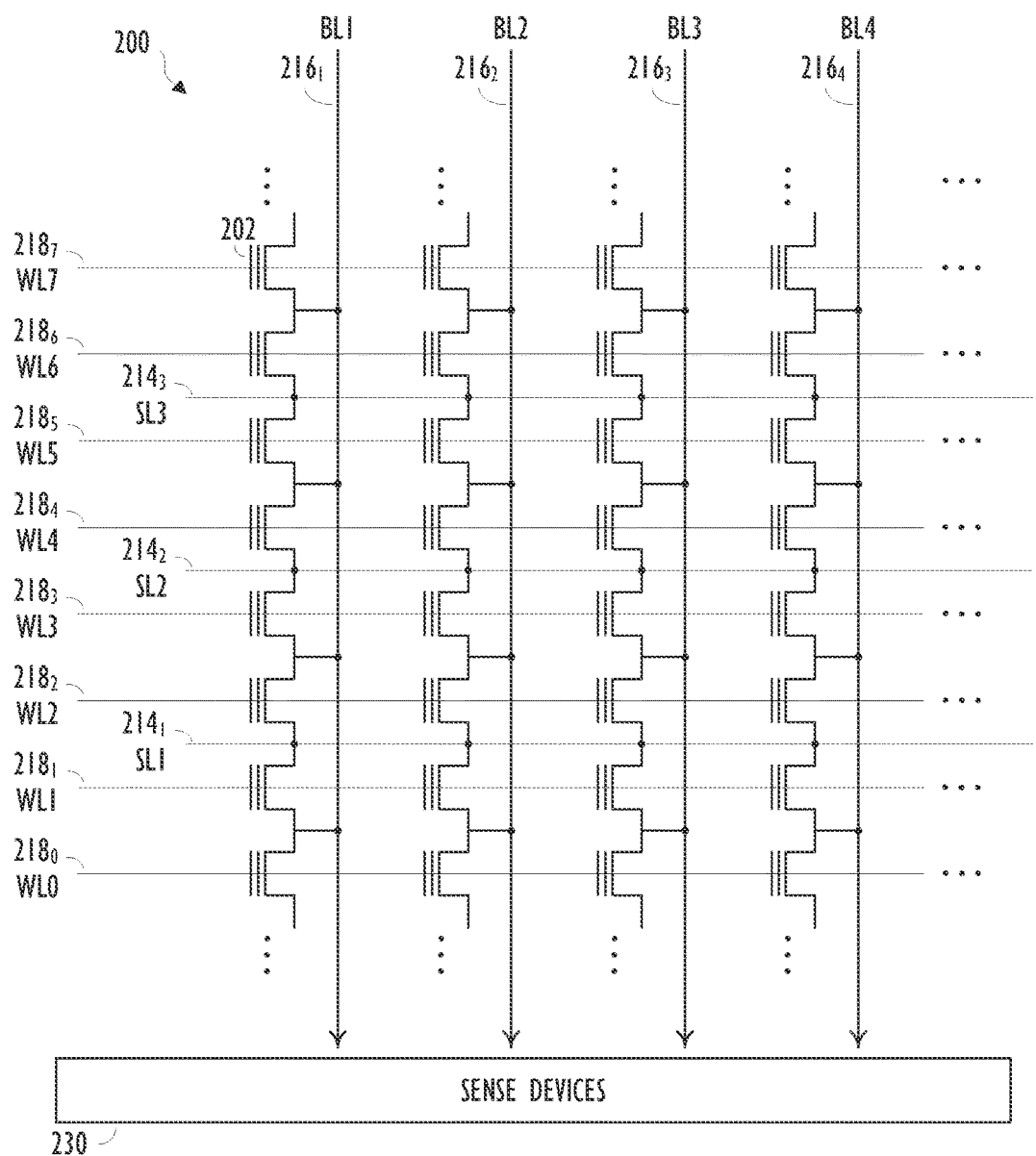
FIG. 2 shows a schematic representation of an array of NOR configured memory cells.

FIG. 2 illustrates a NOR type flash memory array architecture 200 wherein the memory cells 202 of the memory array are logically arranged in an array of rows and columns. Each memory cell 202 is coupled between a source line 214 and a bit line 216. The array is accessed by a row decoder (not shown) activating a logical row of memory cells by selecting a particular word line, such as WL7-WL0 $218_{7-0}$, for example. Each word line 218 is coupled to the control gates of a row of memory cells. Bit lines BL1-BL4 $216_{1-4}$ can be driven high or low depending on the type of operation being performed on the array. Bit lines BL1-BL4 $216_{1-4}$ are coupled to sense devices 230 that detect the state of a target memory cell by sensing voltage or current on a particular bit line 216, for example. As is known to those skilled in the art, the number of memory cells, word lines and bit lines might be much greater than those shown in FIG. 2.

Memory cells (e.g., flash memory cells) can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell, depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. MLC memory cells may store even or odd numbers of bits on each memory cell, and schemes providing for fractional bits are also known. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

Figure 3:
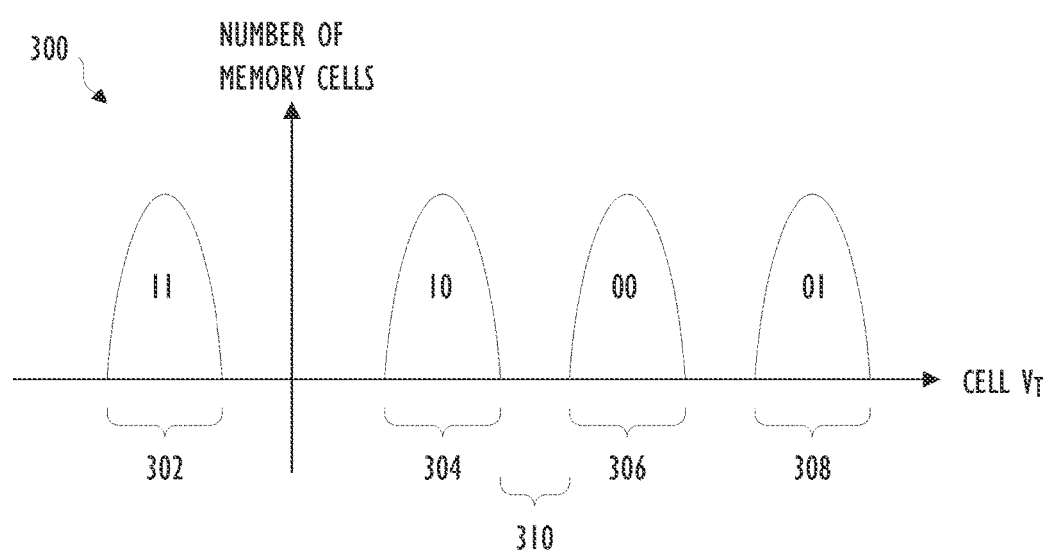
FIG. 3 shows a graphical representation of threshold voltage ranges in a population of memory cells.

FIG. 3 illustrates an example of Vt ranges 300 for a MLC (four level) (e.g., 2-bit) memory cell. For example, a memory cell might be programmed to a Vt that falls within one of four different Vt ranges 302-308 of 200 mV, each being used to represent a data state corresponding to a bit pattern comprised of two bits. Typically, a dead space 310 (e.g., sometimes referred to as a margin and might have a range of 200 mV to 400 mV) is maintained between each range 302-308 to keep the ranges from overlapping. As an example, if the voltage stored on a memory cell is within the first of the four Vt ranges 302, the cell in this case is storing a logical '11' state and is typically considered the erased state of the cell. If the voltage is within the second of the four Vt ranges 304, the cell in this case is storing a logical '10' state. A voltage in the third Vt range 306 of the four Vt ranges would indicate that the cell in this case is storing a logical '00' state. Finally, a Vt residing in the fourth Vt range 308 indicates that a logical '01' state is stored in the cell.

Typically there is a greater likelihood of errors occurring in data stored in higher level memory cells than in lower level memory cells. For example, MLC (four level) typically has a higher likelihood of errors than SLC memory, for example. This can be caused by the increased number and narrowing of the Vt ranges programmed in higher level memory cells. As discussed above, the number of program/erase cycles performed on a memory cell may also increase the likelihood of errors. Thus, MLC memory cells may be more susceptible to program/erase cycle induced errors than SLC memory cells, for example.

Phase-change memory (PCM) is another form of non-volatile memory (not shown in the Figures) that uses a reversible process of changing the state of an alloy containing one or more elements from Group V or VI of the periodic table between amorphous and crystalline states upon application of an electric current, and wherein the two states have substantially different electrical resistance. Typical current phase change memories use a chalcogenide alloy, such as a Germanium-Antimony-Tellurium (GeSbTe, or GST, most commonly $Ge_2Sb_2Te_5$) alloy. The amorphous (a-GST) and crystalline (c-GST) states of the material have largely different resistivity, on the order of three orders of magnitude, so that a determination of the state is easily done. The crystalline state has typical resistance on the order of kilo-Ohms (K), whereas the amorphous state has typical resistance on the order of megaOhms (M). The states are stable under normal conditions, so the PCM cell is a non-volatile cell with a long data retention. When the GST is in its amorphous state, it is said to be RESET. When the GST is in its crystalline state, it is said to be SET. PCM memory does not require an erase operation to be performed prior to performing a write operation, but the number of program cycles performed on a memory cell may increase the likelihood of errors. PCM cells might be read by measuring their resistance, for example.

Figure 4:
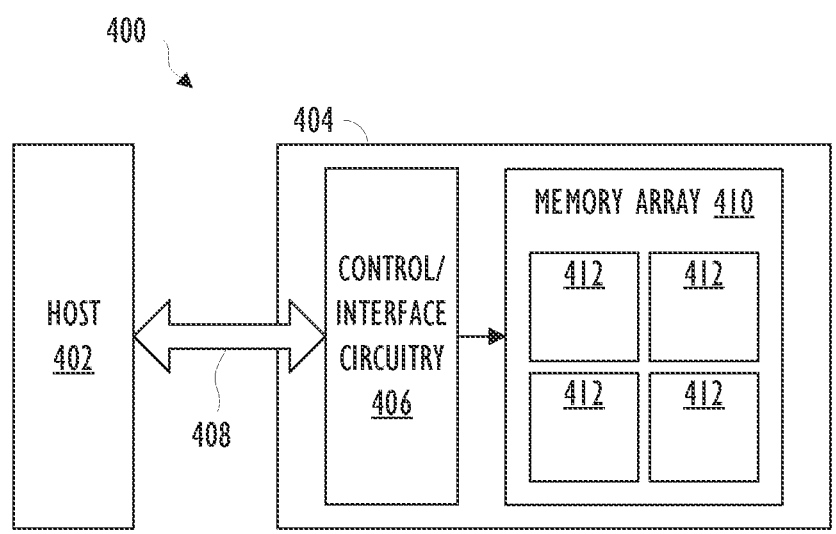
FIG. 4 illustrates a memory device having a number of partitions and coupled to a host as part of an electronic system.

FIG. 4 illustrates a functional block diagram of a typical memory system 400 including a host 402 (e.g., processor) and a memory device 404 coupled by a communications channel 408 (e.g., communications bus.) The memory device 404 comprises an array of memory cells 410 which is configured in a plurality of partitions 412. The memory device further includes control/interface circuitry 406 which is configured to communicate with the host 402 over the communications channel 408. The control/interface circuitry 406 might manage particular operations in the memory device 404, such as operations performed in response to instructions provided to the memory device by the external host 402. The host 402 might send address requests to the memory device 404 over the communications channel 408, such as part of a read or a write request, for example.

Each partition 412 of the plurality of partitions of the memory array 410 comprises a plurality of blocks of memory cells. If wear leveling is to be utilized, the memory device is configured to perform the wear leveling operations uniformly over each partition. However, this might cause undesirable results. The memory array 410 might be a 256 Mb (megabit) array where each partition 412 comprises 64 Mb, for example. Thus, the memory array 410 might comprise four independent wear leveling partitions 412. Thus, if some data to be stored requires a particular level of data retention and different data requires a particular number of program/erase cycles, the two types of data might be stored in different partitions. This can be limiting in that parts of certain partitions might go unused in order to ensure space is available for each type of data. Alternatively, a partition might be filled while additional data of the same type might still need to be stored in the memory device. For example, if data to be excluded from wear leveling exceeds a multiple of the 64 Mb partition size, an entire additional partition might need to be excluded from wear leveling, for example. This additional data might alternatively have to be stored in a different partition which could expose the additional data to undesirable wear leveling operations in the memory device, for example.

Memory devices and methods according to various embodiments according of the present disclosure provide for adjusting how particular blocks of memory cells will be managed with respect to wear leveling operations, such as excluding particular blocks from experiencing wear leveling operations in memory devices. For example, a memory device might comprise a memory array configured as a single partition across the entire memory array. According to various embodiments of the present disclosure, particular blocks of memory of this single partition might be excluded from wear leveling operations. Thus, various embodiments according to the present disclosure facilitate storing data having a particular desired data retention characteristic along with storing data having a particular desired number of program/erase cycles without concern that wear leveling operations will affect the desired data retention characteristics. This can provide improved flexibility and more efficient use of the memory locations in the memory array because a memory device according to various embodiments of the present disclosure is not limited to uniformly applying wear leveling across entire partitions as is the case in the prior art.

Figure 5:
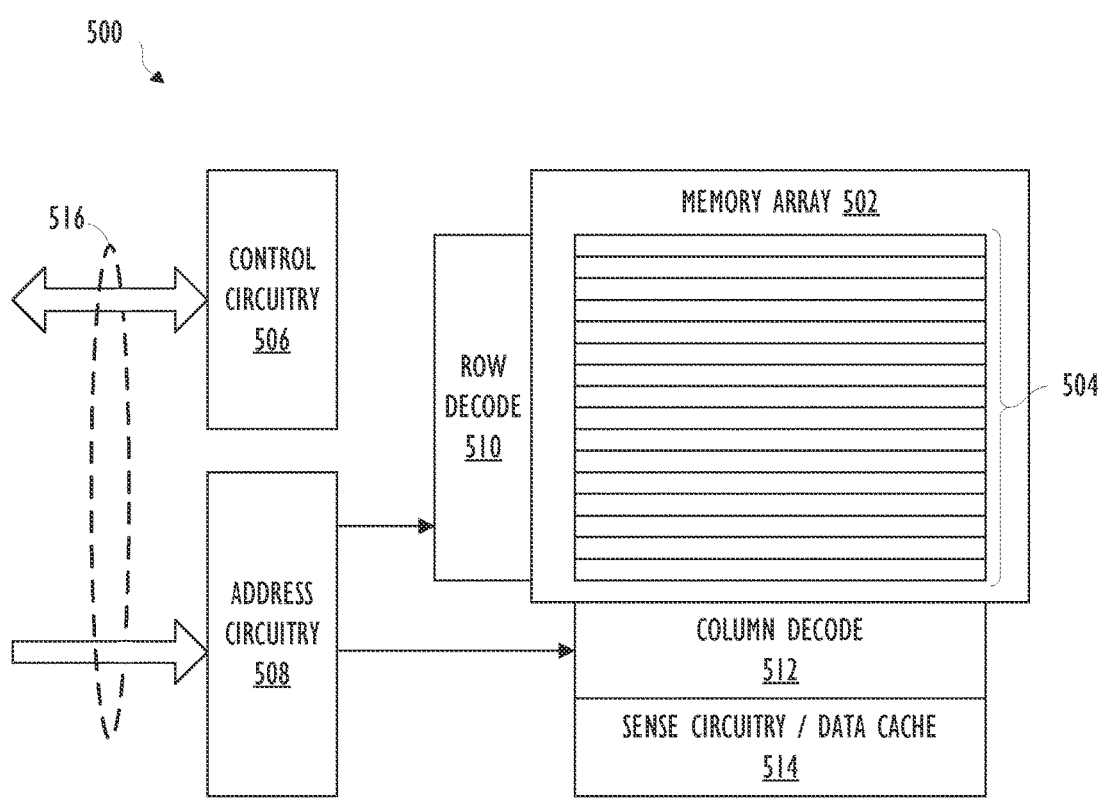
FIG. 5 illustrates a simplified block diagram of a memory device according to an embodiment of the present disclosure.

FIG. 5 illustrates a portion of a memory device 500 according to various embodiments of the present disclosure. The memory device 500 shown in FIG. 5 has been simplified to focus on particular elements to improve understanding of various embodiments according to the present disclosure. Memory device 500 comprises a memory array 502, such as an array of flash memory cells, for example. The memory array might be configured in a NAND and/or a NOR configuration. The memory array 502 shown in FIG. 5 might comprise one or more partitions and/or plurality of individually erasable blocks 504 of memory cells, where each block might comprise one or more pages of memory. The memory cells of each block of memory array 502 might be logically arranged in rows and in columns such as shown in FIG. 1 or 2, for example. The memory cells of memory array 502 might comprise single level (SLC) and/or multi level (MLC) memory cells. Memory array 502 might comprise types of non-volatile memory other than flash memory cells according to various embodiments of the present disclosure. For example, memory array 502 might include non-volatile memory cells such as nitride read-only memory (NROM) cells, ferroelectric field-effect transistor memory cells, phase-change (PCM) memory cells and other memory using changes in threshold voltage, resistance and/or other characteristics to store a data value, for example.

Memory device 500 further comprises row decode circuitry 510 and column decode circuitry 512 which facilitate access to the memory cells of the memory array 502. Address circuitry 508 provides addressing information to the row decode circuitry 510 and to the column decode circuitry 512. Sense circuitry and data cache 514 help facilitate memory device operations such as reading, writing (e.g., programming) and erase operations. For example, the sense circuitry 514 might detect the programmed state of a particular number of selected memory cells to be read. Data cache 514 might store data sensed by the sense circuitry (e.g., such as sense information obtained during a read or verify operation.) Data cache 514 might also store data to be programmed into a particular number of selected memory cells, such as during a programming operation, for example.

Memory device 500 further comprises control circuitry (e.g., controller) 506 which at least in part facilitates memory device operations according to various embodiments of the present disclosure. The control circuitry 506 might be configured to communicate with an external host (e.g., processor) (not shown in FIG. 5) through a communications channel 516. The control circuitry 506 might be coupled to other circuitry of the memory device 500 (not shown), such as to the row decode circuitry 510, column decode circuitry 512 and sense circuitry/data cache 514 circuitry, for example. According to one or more embodiments of the present disclosure, control circuitry 506 might be configured to manage wear leveling of particular blocks of the memory array 502. For example, particular identified blocks might be excluded from wear leveling operations facilitated by the control circuitry 506. Thus, according to one or more embodiments of the present disclosure, wear leveling operations might only be applied to a subset of the blocks of the memory device, thereby excluding other blocks from wear leveling operations, for example. According to one or more embodiments of the present disclosure, the control circuitry is configured to manage the wear leveling operations within the memory device 500 independent of an external host which might be coupled to it.

Figure 6:
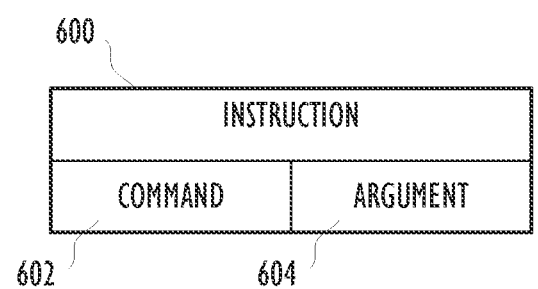
FIG. 6 illustrates a block diagram of a instruction according to an embodiment of the present disclosure.

FIG. 6 illustrates a block diagram of an instruction 600 which might be transmitted over the communication channel 516 and received by the control circuitry 506 of FIG. 5 according to an embodiment of the present disclosure. The instruction 600 might be generated by a host device coupled to the memory device by the communications channel 516, for example. The instruction 600 comprises a command portion 602 which includes the command indicating a particular task to be performed. For example, to identify particular data and/or blocks of memory to be excluded from wear leveling operations. The instruction 600 further comprises an argument portion 604. The argument portion of the instruction might comprise information identifying the data and/or blocks to be excluded from wear leveling operations. For example, the argument information 604 might identify the location of a particular block of memory in the memory device. The argument information 604 might alternatively comprise a particular range, or ranges of memory blocks. The argument 604 might comprise a particular starting and ending address of identified blocks. The argument might alternatively comprise a start address and a particular number indicative of a number of addresses following the start address. Other arguments are possible to identify particular blocks according to various embodiments of the present disclosure.

The command portion 602 might also comprise a write instruction generated by the host and the argument portion 604 might comprise an address (e.g., a logical address) associated with data to be written. The command portion 602 might include a command indicating a write operation and might further include an indicator (e.g., flag) which indicates to the memory device if the data is to be excluded from wear leveling operations according to one or more embodiments of the present disclosure, for example. For example, the flag might have a particular value indicative of whether the associated data should be stored in blocks which are excluded from wear leveling. Logical address to physical address translation, such as between a host and a memory device, is well known to those skilled in the art.

Alternatively, the argument information 604 might indirectly identify one or more blocks to be excluded from wear leveling operations by directly identifying one or more blocks to be included in wear leveling operations according to various embodiments, for example. Thus, by identifying blocks to be included in wear leveling operations, blocks to be excluded from wear leveling operations are indirectly identified. According to one or more of these embodiments, the control circuitry might be configured instead to only perform wear leveling operations on blocks specifically identified to be included in wear leveling operations and to not perform wear leveling on blocks not specifically identified, for example.

Referring again to FIG. 5, control circuitry 506 might comprise a memory device (e.g., non-volatile memory) (not shown in FIG. 5) in which the identified block information might be stored. Identified block information might comprise information regarding whether a particular block has been selected to be excluded from wear leveling operations, for example. The identified block information might also be stored in a particular portion of the memory array 502, for example. During an initialization operation of the memory device (e.g., such as following a RESET operation), the stored identified block information might be read from the memory storing the identified block information and be loaded into the controller 506, for example. Control circuitry 506 might include registers into which the identified block information might be loaded either upon receipt from the host and/or as read from memory during initialization, for example. As part of performing wear leveling operations within the memory device, the control circuitry 506 checks the identified block information stored in the register to determine which blocks have been identified with respect to wear leveling operations according to various embodiments of the present disclosure.

Control circuitry 506 might exclude particular blocks of memory from wear leveling operations yet still allow programming operations to be performed on the identified blocks, such as responsive to an external address request to perform a write operation, according to various embodiments of the present disclosure. For example, a particular group of blocks might be identified to be excluded from wear leveling operations but might store data that may need to be changed (e.g., updated) at some point in the future. Thus, changes to the data stored in these identified memory blocks might be facilitated when requested by an external host, yet are excluded from wear leveling operations performed internal to the memory device 500 according to various embodiments of the present disclosure.

Figure 7:
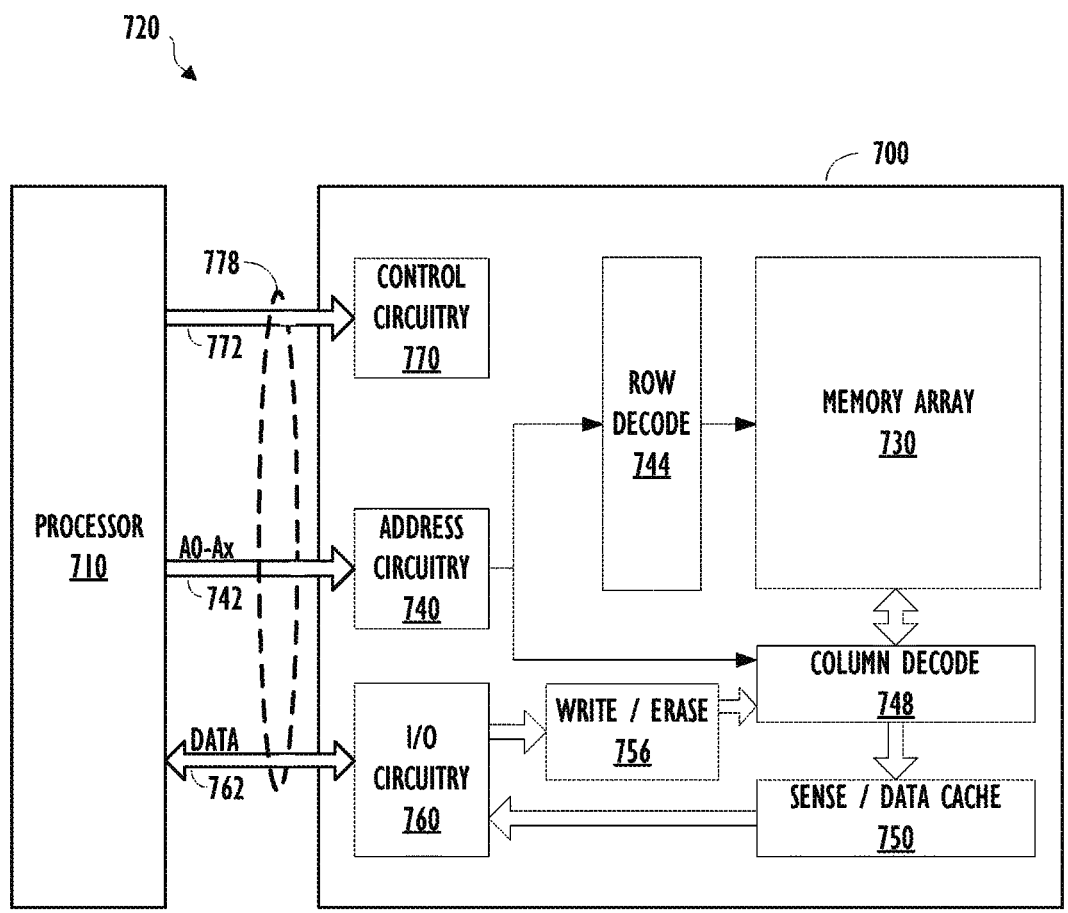
FIG. 7 is a simplified block diagram of a memory device coupled to a host as part of an electronic system according to an embodiment of the present disclosure.

FIG. 7 is a functional block diagram of an electronic system having at least one memory device 700 according to one or more embodiments of the present disclosure. The memory device 700 illustrated in FIG. 7 is coupled to a host such as a processor 710. The processor 710 may be a microprocessor or some other type of controlling circuitry. The memory device 700 and the processor 710 form part of an electronic system 720. According to one or more embodiments of the present disclosure, the memory device 700 might comprise the memory device 500 discussed above with respect to FIG. 5, for example. The memory device 700 has been simplified to focus on features of the memory device that are helpful in understanding various embodiments of the present disclosure.

The memory device 700 includes one or more memory arrays 730 that might be logically arranged in banks of rows and columns. According to one or more embodiments, the memory cells of memory array 730 are flash memory cells. The memory array 730 might include multiple banks and blocks of memory cells residing on a single or multiple die as part of the memory device 700. Memory array 730 might comprise SLC and/or MLC memory. The memory array 730 might also be adaptable to store varying densities (e.g., MLC (four level) and MLC (eight level)) of data in each cell, for example.

An address buffer circuit 740 is provided to latch address signals provided on address input connections A0-Ax 742. Address signals are received and decoded by a row decoder 744 and a column decoder 748 to access the memory array 730. Row decoder 744 might comprise driver circuits configured to drive the word lines of the memory array 730, for example. It will be appreciated by those skilled in the art, with the benefit of the present description, that the number of address input connections 742 might depend on the density and architecture of the memory array 730. That is, the number of address digits increase with both increased memory cell counts and increased bank and block counts, for example.

The memory device 700 reads data in the memory array 730 by sensing voltage or current changes in the memory array columns using sense devices, such as sense/data cache circuitry 750. The sense/data cache circuitry 750, in at least one embodiment, is coupled to read and latch a row of data from the memory array 730. Data input and output (I/O) buffer circuitry 760 is included for bi-directional data communication over a plurality of data connections 762 with the processor 710. Write/erase circuitry 756 is provided to write data to or to erase data from the memory array 730.

Control circuitry 770 is configured at least in part to implement various embodiments of the present disclosure, such as facilitating wear leveling operations discussed above, for example. In at least one embodiment, the control circuitry 770 may utilize a state machine. Control circuitry 770 might be similar in configuration and functionality as control circuitry 506 discussed above with respect to FIG. 5, for example.

Control signals and commands can be sent by the processor 710 to the memory device 700 over the command bus 772. The command bus 772 may be a discrete signal line or may be comprised of multiple signal lines, for example. These command signals 772 are used to control the operations on the memory array 730, including data read, data write (e.g., program), and erase operations. The instruction 600 discussed above with respect to FIG. 6 might be transmitted from the processor 710 to the memory device 700 over the command bus 772, for example. The command bus 772, address bus 742 and data bus 762 may all be combined or may be combined in part to form a number of standard interfaces 778. For example, the interface 778 between the memory device 700 and the processor 710 might be a Universal Serial Bus (USB) interface. The interface 778 might also be a standard interface used with many hard disk drives (e.g., SATA, PATA) as are known to those skilled in the art.

The electronic system illustrated in FIG. 7 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide wear leveling operation management methods in a memory device. Specifically, particular blocks are identified as blocks which might be excluded from, wear leveling operations in the memory device, whether directly or indirectly. Thus, desired data retention characteristics and desired program/erase cycles might be achieved in the same memory device while further improving the efficient utilization of the device. These methods might facilitate a more efficient allocation of memory cells having desired program/erase cycling characteristics along with memory cells having a desired data retention characteristics.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device having an array of memory cells arranged in a plurality of blocks, the method comprising:
  receiving an instruction from a host device in communication with the memory device, wherein the instruction comprises a command portion indicating a desire to identify portions of the memory device to be excluded from wear leveling operations and an argument portion comprising information identifying a particular group of one or more blocks of the plurality of blocks, wherein the command portion of the instruction further indicates a desire to perform an other operation on the particular group of one or more blocks of the plurality of blocks;
  storing the information identifying the particular group of one or more blocks to a non-volatile memory of the memory device as a portion of information identifying blocks to be excluded from wear leveling operations;
  performing the other operation on the particular group of one or more blocks of the plurality of blocks; and
  performing one or more wear leveling operations only on a subset of the plurality of blocks responsive to the information identifying blocks to be excluded from wear leveling operations;
  wherein the subset of the plurality of blocks and the particular group of one or more blocks of the plurality of blocks are mutually exclusive.

2. A method of operating a memory device having an array of memory cells arranged in a plurality of blocks, the method comprising:
  receiving an instruction from a host device in communication with the memory device, wherein the instruction comprises a command portion indicating a desire to identify portions of the memory device to be excluded from wear leveling operations and an argument portion comprising information identifying a particular group of one or more blocks of the plurality of blocks;
  storing the information identifying the particular group of one or more blocks to a non-volatile memory of the memory device as a portion of information identifying blocks to be excluded from wear leveling operations; and
  performing one or more wear leveling operations only on a subset of the plurality of blocks responsive to the information identifying blocks to be excluded from wear leveling operations;
  wherein receiving the instruction further comprises receiving the instruction comprising the command portion containing a write instruction.

3. The method of claim 2, wherein the particular group of one or more blocks identified by the received instruction comprise blocks of the plurality of blocks to be excluded from wear leveling operation performed in the memory device.

4. The method of claim 3, wherein performing the one or more wear leveling operations responsive to the information identifying blocks to be excluded from wear leveling operations comprises performing the one or more wear leveling operations only on blocks of the plurality of blocks other than blocks identified in the information identifying blocks to be excluded from wear leveling operations.

5. The method of claim 2, wherein the particular group of one or more blocks identified by the received instruction comprise blocks of the plurality of blocks to be included in wear leveling operations performed in the memory device.

6. The method of claim 5, wherein the information identifying blocks to be excluded from wear leveling operations is information indirectly identifying blocks to be excluded from wear leveling operations by identifying blocks to be included in wear leveling operations, and wherein performing the one or more wear leveling operations responsive to the information identifying blocks to be excluded from wear leveling operations further comprises performing the one or more wear leveling operations only on blocks of the plurality of blocks identified in the information identifying blocks to be excluded from wear leveling operations.

7. The method of claim 2, wherein receiving the instruction further comprises receiving the instruction comprising the argument portion identifying a range of blocks of the plurality of blocks comprising the particular group of blocks.

8. The method of claim 2, wherein receiving the instruction further comprises receiving the instruction comprising the argument portion identifying a start address and an ending address of blocks of the plurality of blocks comprising the particular group of blocks.

9. The method of claim 2, wherein receiving the instruction further comprises receiving the instruction comprising the argument portion identifying a start address and a particular number indicative of a range of addresses following the start address.

10. The method of claim, wherein receiving the instruction further comprises receiving the instruction comprising the argument portion containing a logical address.

11. The method of claim 10, wherein receiving the instruction further comprises receiving the instruction comprising the command portion containing a flag having a value indicative that the logical address corresponds to a physical block to be excluded from wear leveling operations.

12. A method of operating a memory device having an array of memory cells arranged in a plurality of blocks, the method comprising:
  receiving an instruction from a host device in communication with the memory device, wherein the instruction comprises a command portion indicating a desire to identify portions of the memory device to be excluded from wear leveling operations and an argument portion comprising information identifying a particular group of one or more blocks of the plurality of blocks to be excluded from wear leveling operations, wherein the command portion of the instruction further indicates a desire to perform an other operation on the particular group of one or more blocks of the plurality of blocks;
  storing the information identifying the particular group of one or more blocks to a non-volatile memory of the memory device as a portion of information identifying blocks to be excluded from wear leveling operations;
  performing the other operation on the particular group of one or more blocks of the plurality of blocks; and
  performing one or more wear leveling operations only on blocks of the plurality of blocks not included in the information identifying blocks to be excluded from wear leveling operations.

13. A method of operating a memory device having an array of memory cells arranged in a plurality of blocks, the method comprising:
  receiving an instruction from a host device in communication with the memory device, wherein the instruction comprises a command portion indicating a desire to identify portions of the memory device to be excluded from wear leveling operations and an argument portion comprising information identifying a particular group of one or more blocks of the plurality of blocks to be excluded from wear leveling operations, further comprising receiving a write instruction as a portion of the command portion of the instruction;
  storing the information identifying the particular group of one or more blocks to a non-volatile memory of the memory device as a portion of information identifying blocks to be excluded from wear leveling operations; and
  performing one or more wear leveling operations only on blocks of the plurality of blocks not included in the information identifying blocks to be excluded from wear leveling operations.

14. The method of claim 13, further comprising receiving a logical address as a portion of the argument portion of the instruction.

15. The method of claim 14, further comprising receiving a flag as a portion of the command portion of the instruction, wherein the flag has a value indicating that the logical address corresponds to a physical block of the plurality of blocks to be excluded from wear leveling operations.

16. The method of claim 13, further comprising identifying the particular group of one or more blocks as a range of blocks.

17. The method of claim 16, further comprising identifying the particular group of one or more blocks as a range of blocks by identifying a start address and an ending address of blocks of the plurality of blocks.

18. The method of claim 16, further comprising identifying the particular group of one or more blocks as a range of blocks by identifying a start address and a particular number indicative of a range of addresses following the start address.

19. A method of operating a memory device having an array of memory cells arranged in a plurality of blocks, the method comprising:
  receiving an instruction from a host device in communication with the memory device, wherein the instruction comprises a command portion indicating a desire to identify portions of the memory device to be excluded from wear leveling and an argument portion comprising information identifying a particular group of one or more blocks of the plurality of blocks to be included in wear leveling operations;
  storing the information identifying the particular group of one or more blocks to a non-volatile memory of the memory device as a portion of information indirectly identifying blocks to be excluded from wear leveling operations; and
  performing one or more wear leveling operations only on blocks of the plurality of blocks included in the information indirectly identifying blocks to be excluded from wear leveling operations.

20. The method of claim 19, further comprising identifying the particular group of one or more blocks as a range of blocks by identifying a start address and identifying either an ending address of blocks of the plurality of blocks or a particular number indicative of a range of addresses following the start address.

\* \* \* \* \*

UNITED STATES PATENT AND TRADEMARK OFFICE
CERTIFICATE OF CORRECTION

PATENT NO.         : 9,710,376 B2
APPLICATION NO.    : 14/753369
DATED              : July 18, 2017
INVENTOR(S)        : Baltar Page 1 of 1

It is certified that error appears in the above-identified patent and that said Letters Patent is hereby corrected as shown below:

In the Claims

Column 11, Claim 10, Line 35, delete "The method of claim, wherein" and insert in place thereof --The method of claim 9, wherein--.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*